United States Patent [19]
Damiano et al.

[11] Patent Number: 5,639,014
[45] Date of Patent: Jun. 17, 1997

[54] INTEGRAL SOLDER AND PLATED SEALING COVER AND METHOD OF MAKING SAME

[75] Inventors: David M. Damiano; Mark Fery; Terry J. Oldham, all of Spokane, Wash.

[73] Assignee: Johnson Matthey Electronics, Inc., Spokane, Wash.

[21] Appl. No.: 498,538

[22] Filed: Jul. 5, 1995

[51] Int. Cl.$^6$ .................... H01L 21/50; B23K 31/02
[52] U.S. Cl. .................. 228/254; 228/235.2; 228/170
[58] Field of Search ......................... 228/124.6, 170, 228/208, 209, 214, 235.2, 254; 174/52.5

[56] References Cited

U.S. PATENT DOCUMENTS

| | | | |
|---|---|---|---|
| 3,823,468 | 7/1974 | Hascoe | 29/588 |
| 3,874,549 | 4/1975 | Hascoe | 220/200 |
| 4,020,987 | 5/1977 | Hascoe | 228/124.6 |
| 4,331,253 | 5/1982 | Gordon et al. | 220/200 |
| 4,331,258 | 5/1982 | Geschwind | 220/359 |
| 4,372,037 | 2/1983 | Scapple et al. | 228/124.1 |
| 4,601,958 | 7/1986 | Levine | 428/672 |
| 4,640,436 | 2/1987 | Trevison et al. | 220/359 |
| 4,640,438 | 2/1987 | Trevison et al. | 220/359 |
| 4,666,796 | 5/1987 | Levine | 428/670 |
| 4,737,418 | 4/1988 | Slattery | 228/209 |
| 4,750,665 | 6/1988 | Falanga | 228/124.1 |
| 4,835,067 | 5/1989 | Levine | 428/669 |
| 4,842,961 | 6/1989 | Basile et al. | 428/672 |
| 4,854,495 | 8/1989 | Yamamoto et al. | 228/124.6 |

*Primary Examiner*—Samuel M. Heinrich
*Attorney, Agent, or Firm*—Christie, Parker & Hale, LLP

[57] ABSTRACT

A method of making an integral solder and plated cover for an electronic package is described which involves applying a corrosion resistant material onto a metal strip and a solderable material on the corrosion resistant material. A solder material is then roll clad over the solderable material after which it is stamped to covers which are then coated with gold.

8 Claims, 2 Drawing Sheets

5,639,014

INTEGRAL SOLDER AND PLATED SEALING COVER AND METHOD OF MAKING SAME

BACKGROUND OF THE INVENTION

The present invention relates to a sealing cover for an electronic package and to a method of making a cover with integral solder and plated sealing surfaces. More particularly, the invention relates to a sealing cover for use with a hermetically sealed package that contains a semiconductor device, a surface acoustical wave device, oscillator or other microelectronic component.

Typically, metal lids used as covers for hermetically sealing electronic packages have employed a plated metal lid, such as a lid with iron-nickel alloy substrate over which nickel and gold layers are plated, and using a solder preform, generally attached by tack welding before sealing. The present invention provides an alternative method of making a sealing cover more economically by combining a series of process steps in a unique combination to produce a novel cover with integral solder and plated sealing surfaces.

The industry-standard sealing cover is a metal cover with an iron-based substrate material, typically Alloy 42, or Kovar, which has been punched or stamped and then plated with nickel as a corrosion barrier and gold as a solderable metal layer. To this plated stamping, a gold and 20% tin eutectic solder preform is attached, usually in the form of a "ring" appropriately sized to fit the stamping and the package to which the stamping will act as a cover. The ring is secured to the package initially by electric spot welding. The assembly process described is quite labor intensive and requires careful control. Moreover, the assembled parts are relatively fragile and careful handling and packaging is necessary to protect the integrity of the assembly. For large metal covers, i.e., 0.5 inches or greater in a major dimension, the primary costs of manufacture is in the precious metals involved, while the manufacturing and assembling costs are comparatively less. However, as the size of the sealing cover to be made decreases, assembling and manufacturing costs become an increasing cost factor, and for small metal covers, i.e., 0.3 inches or less in a major dimension, the assembly labor costs may exceed the material costs.

To reduce manufacturing and labor costs associated with small sealing covers, roll cladding has been proposed to attach the corrosion barrier, solderable material and solder material to the substrate. After assembling the roll clad composite in strip form, segments are stamped or punched from the strip to form sealing covers. However, products made by this method have several significant drawbacks. The edges of the cover after stamping have exposed substrate material which is both subject to corrosion and does not provide a solderable surface on which a solder fillet can readily form when the cover is sealed to the package. The solder fillet is known to be an important factor in the integrity of the finished package, especially in hermetic sealing applications, by preserving the seal. Furthermore, multi-component cladding processes are also difficult to control due to the complexity of bringing five layers of material together in proper alignment, with correct incident angles to the mill rolls and proper tension to achieve clad adhesion and yet not stretch the material, while constantly maintaining cleanliness of the individual layers. To achieve the desired ultimate thickness in such a process, each layer of material must first be rolled to precise thickness tolerances, slit to correct widths and cleaned; all of which involve significant manufacturing costs. The gold layer typically used to assure adherence of the solder layer and the multi-component cladded composite also has to be considerably thicker than functionally required since extremely thin gold layers, e.g., foils, are too fragile to handle with the back-tension required for the roll cladding process. The need to use excess gold also adds to the material costs.

SUMMARY OF THE INVENTION

In accordance with the invention, there is provided a method of making a sealing cover with integral solder and plated surfaces for an electronic package which comprises: providing a substrate in strip form with longitudinal surfaces and edges, as a core of the cover; continuously applying a corrosion resistant material onto the strip surfaces and continuously applying solderable material over the corrosion resistant material on at least one of the strip surfaces. Thereafter, solder material is applied over the solderable material, e.g. by roll cladding, to produce a soldered strip. Sections of the clad strip are then stamped out and plated with a solderable material, such as a noble metal, e.g. gold, to cover the critical sealing surfaces of the stampings, to produce a cover with plated critical sealing surfaces. The term "critical sealing surfaces" as used throughout the application and claims refers to the edges of the cover and at least one side.

In another embodiment of the invention, the solder material is applied over the solderable material, such as by roll cladding, as a strip with discontinuous voids and each of the sections of the clad strip is stamped out to produce a package cover which encompasses a region void of solder on the seal side. In this way, a sealing cover may be produced with solder in a so-called "ring" or "picture frame" configuration.

DETAILED DESCRIPTION

Figure 1:
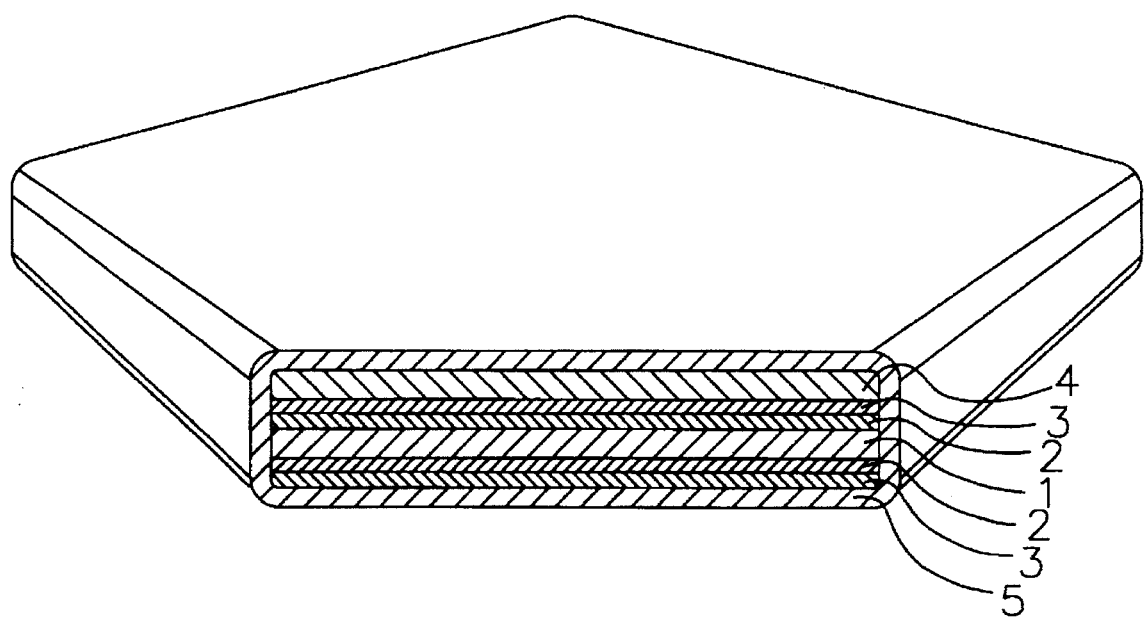
FIG. 1 is a diagram of a cover plated on critical sealing surfaces shown in isometric view with a breakaway portion describing the interior.

The method in accordance with the invention is directed to producing a metal sealing cover that incorporates the excellent functional characteristic of conventional metal covers while achieving significant reduction in manufacturing costs, even beyond the reductions achievable through multi-component cladding. These cost savings are achieved by the process of the invention.

Referring to the drawings wherein like numbers refer to like parts, a substrate material, 1, is provided in strip form and continuously electroplated with a corrosion barrier layer, 2, a solderable material, 3, also referred to as an adhesion layer for the solder, plated on at least one of the surfaces of the corrosion barrier layer and then roll cladded with a solder layer, 4. Vapor deposition is a possible alternate method for depositing the corrosion resistant and solderable layers. Sealing covers of appropriate dimensions are stamped or punched to desired dimensions and the covers are then plated with a solderable layer, 5, of metal over the critical sealing surfaces.

Figure 2:
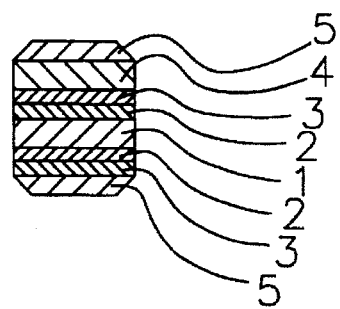
FIG. 2 is a cross-section of the clad plated cover shown in FIG. 1.

The cladding strip which deals with only two components is considerably simpler and easier to control than a multilayer cladding process, previously described and, moreover, the thickness of the corrosion barrier and solder adhesion layers are readily controllable. This is particularly important for the solder adhesion layer, i.e., the solderable material, which is typically gold, since a very thin layer can be deposited and still provide the necessary function. By the process described, labor costs are substantially reduced. The final plating process, preferably a batch or barrel plating process, deposits a solderable and corrosion resistant layer, 5, on the critical sealing surfaces of the cover, thus providing a cover that exhibits good functional performance. No special handling of the finished parts is required since the solder layer is intimately attached to the cover. The embodiment of the integral solder and plated sealing cover described is illustrated in FIGS. 1 and 2.

Figure 3:
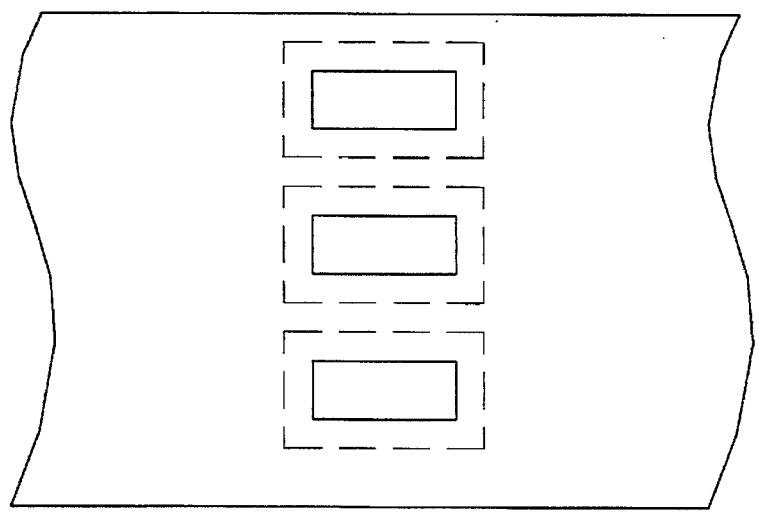
FIG. 3 is a schematic diagram of a strip after cladding in such a manner as to produce a "ring" or "picture frame" structure.
Figure 4:
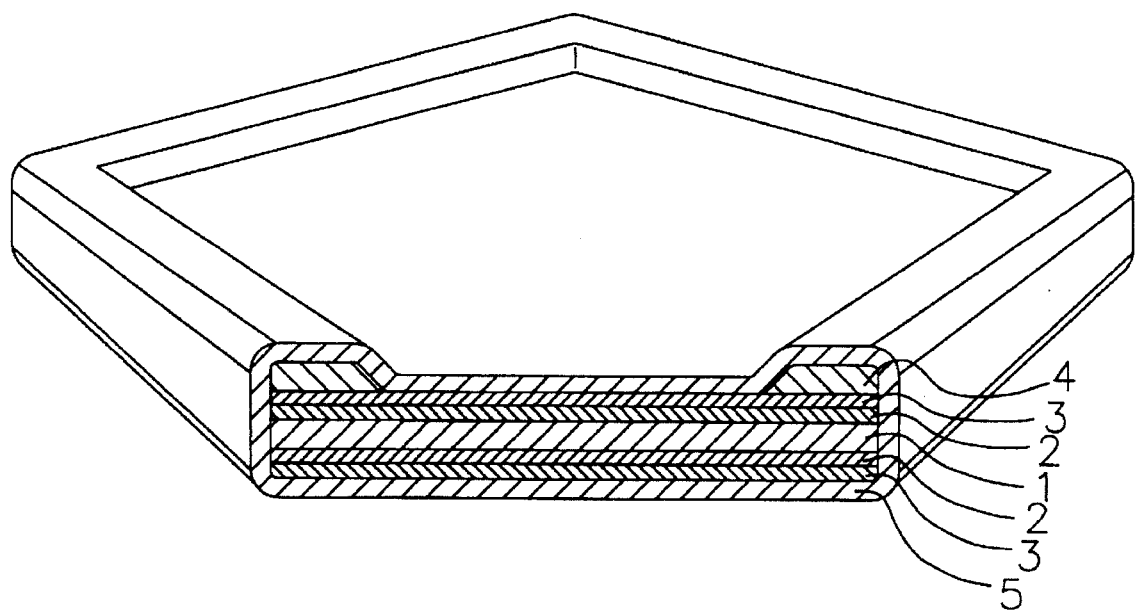
FIG. 4 is an isometric view, partly in section, of a "picture frame" shaped clad plated cover.

As discussed previously, a further embodiment of the invention includes using a solder strip punched with voids prior to cladding, in effect providing regions on the clad strip which are free of solder, and then stamping or punching the resulting composite to encompass the solder-free region. The resultant punched sealing covers exhibit solder in a "picture frame" configuration, as is illustrated in FIGS. 3 and 4 of the drawings. The punched covers are then plated as previously described to provide a solderable and corrosion-resistant layer on the critical sealing surfaces.

As mentioned, the core of the sealing cover, 1, is typically an alloy such as an alloy of iron and nickel, including alloys of iron, nickel and cobalt, etc., which is electroplated with a layer of corrosion material, 2, generally, nickel, on both sides but not on the edges. This plated core is then plated with a solderable material, 3, typically gold, on one or both sides, but not on the edges. A solder material, 4, such as 80% gold and 20% tin eutectic alloy, is then intimately attached, either across the entire surface or in a "ring" formation of appropriate dimensions for ultimate package sealing, over which the critical sealing surfaces, an appropriate metal, 5, is plated to provide a solderable and corrosion resistant layer on the surfaces so plated. A material such as gold, which is readily wettable by solder material while still being soluble in the solder so as not to inhibit wetting of the solder to the package seal ring, may be used.

In an alternative embodiment, a substrate may be electroplated in a strip form with two dissimilar metals in multiple layers, followed by roll cladding of the solder material to the electroplated substrate which is then punched or stamped to form covers of desired dimensions. The covers are then electroplated on the critical sealing surfaces, to form a protective layer to which solder can readily wet and form a consistent solder fillet after package sealing.

To produce a sealing cover with a solder "ring", the solder material is first punched with holes of appropriate dimensions such that, after the solder material is clad to the plated substrate material, regions without solder are present on the strip around which the covers are punched or stamped around these regions so as to ultimately result in a "ring" of solder on the cover of the desired dimensions corresponding to the regions where solder is desired for sealing but not at the non-seal area of the cover over the electronic device within the package.

The following is presented to illustrate the invention.

EXAMPLE 1

For very small parts, i.e., less than 0.150 inches in the major dimension, solder clad across the entire seal side of the cover is usually acceptable. Experimental parts have been produced in which 1.45 inch wide strip of Alloy 42 (iron plus 42% nickel) of 0.01 inch nominal thickness was electroplated with 200 microinches of nickel on both sides, over which 10 microinches of gold was electroplated in strip form on both sides. (Electroplating in strip form means that the strip was continuously plated.) To this plated substrate, gold plus 20% tin solder strip of 0.0018 inch nominal thickness was clad, using a 50% thickness reduction at rolling. The strip after cladding had a nominal thickness of 0.006 inches. From this, plated-clad strip covers of 0.143 by 0.143 inches were punched and then electroplated with gold in a barrel plating process, to a nominal thickness of 20 microinches. In this example, the finished thickness of the layers, determined by XRF and cross-sectioning, was 0.005 inches of Alloy 42, covered with 90 microinches of nickel on both sides covered by 5 microinches of gold on both sides, with 0.0009 inches of gold-tin solder on one side, covered with a minimum of 20 microinches of gold (measured at center of piece, which is a minimum deposit area) over the entire surface, including the edges.

EXAMPLE 2

In another example, a somewhat larger part, 0.120×0.280 inches, was used to demonstrate the preferred practice for making a "ring" sealing cover. A substrate identical to the configuration described above was used. Solder strip of a nominal thickness of 0.003 inches was punched with holes nominally measuring 0.066×0.108 inches, with the holes configured lengthwise along the strip. To accommodate the bell-shaped distortion resulting from the cladding operation, the tooling was designed with a slight trapezoidal taper (0.068 inches at leading edge, tapering to 0.062 inches at the trailing edge). This punched strip was roll clad to the plated substrate strip with a 50% thickness reduction. The resulting solder-free regions were nominally 0.065 inches wide and 0.220 inches long. Around these solder-free regions, the 0.120×0.280 inch covers were punched, then electroplated with a minimum of 20 microinches of gold. Finished thicknesses of the layers (determined by XRF and cross-sectioning) were 0.005 inches of Alloy 42, covered with 90 microinches of nickel on both sides, covered by 5 microinches of gold on both sides, with 0.0015 inches of gold-tin solder in a "ring" on one side, covered with a minimum of 20 microinches of gold (measured at center of part, which is minimum deposit area) over the entire surface, including edges.

EXAMPLE 3

Alloy 42 strip (Fe+42% Ni), 0.010 inch nominal thickness, was strip-plated with 180 microinches of sulfamate nickel on both sides, followed by 10 microinches of strip-plating with gold on both sides. This strip was clad to 0.018 inch thick gold-tin eutectic solder strip (Au+20% Sn), using a 50% reduction in the cladding process. The resultant clad strip was nominally 0.006 inches thick. From this clad strip, parts 0.143 inches square were punched. One batch of punched parts were electroplated with 20 microinches of gold. These parts were tested for solder wettability in a furnaces with nitrogen atmosphere and low oxygen (less than 5 ppm) at a peak temperature of 340° C. The solder exhibited acceptable wetting characteristics. The same parts were also functionally tested on ceramic packages with gold-plated seal rings of appropriate dimensions. Both batches of parts resulted in hermetic seals passing fine and gross leak testing. The solder fillet from the edge of the parts out onto the seal ring was smooth and continuous for both batches of parts. The solder exhibited some tendency to wet to the top surface uniformly around the perimeter. This was attributed to the solder volume in relationship to the thickness of the substrate material. The parts with 20 microinches of plated gold exhibited fillets with a smoother texture than the parts with 10 microinches of plated gold, indicating the importance of adequate plating thickness to good functional performance.

EXAMPLE 4

Optimization experiments led to a preferred practice for the full clad parts. Alloy 42 strip (Fe+42% Ni), 0.015 inch nominal thickness, was strip-plated with 180 microinches of sulfamate nickel on both sides, followed by 10 microinches of strip-plating with gold on one side. This strip was clad to 0.019 inch thick gold-tin eutectic solder strip (Au+20% Sn), using approximately a 50% reduction in the cladding process. The solder was clad to the side of the strip plated with gold. The resultant clad strip was nominally 0.009 inches thick. Because of the gold plating over both the solder and non-solder sides, it is difficult to determine the proper orientation for sealing. Mechanical marking methods were tried, but are difficult to control. To provide a readily identifiable orientation, two method proved successful, both involving "selection plating": (1) The solder side of the strip was masked off with an acid resistant, nonconductive plating mask applied as a spray; and (2) The non-solder "nickel top" side was similarly masked. The advantage of a "nickel top" lid is that it is laser-markable after sealing, although it has slightly less corrosion resistance. From the masked clad, strip parts 0.143 inches square were punched. The parts were electroplated with 25 microinches of gold. The acid-resistant mask was then stripped off using a chemical solvent. These parts were tested for solder wettability in a furnace with nitrogen atmosphere and low oxygen (less than 5 ppm) at a peak temperature of 340° C. The solder exhibited acceptable wetting characteristics. The same parts were also functionally tested on ceramic packages with gold-plated seal rings of appropriate dimensions. The parts produced hermetic seals passing fine and gross leak testing. The solder fillet from the edge of the parts out onto the seal ring was smooth and continuous. The tendency to wet to the top surface around the perimeter was eliminated by using the thicker substrate material and selective plating method previously described.

EXAMPLE 5

"Ring" shaped parts were also produced by the process described: Alloy 42 strip 0.015 inch nominal thickness was strip-plated with 180 microinches of sulfamate nickel on both sides, followed by 10 microinches of gold strip plating on one side. Gold-tin eutectic solder strip with a nominal thickness of 0.0028 inches was punched with trapezoidal holes measuring 0.068 inches wide at leading edge (edge which would enter the rolling mill first during cladding), 0.062 inches wide at trailing edge, and overall length of 0.108 inches. A nominal radius of 0.010 inches was used on all corners to prevent cracking during the cladding operation. A trapezoidal shape was used to overcome the known dimensional distortion which results during roll cladding. This solder strip with holes was roll clad to the plated substrate material on the gold-plated side using an approximately 50% reduction. The resultant clad strip was nominally 0.009 inches thick, with rectangular solder-free regions nominally 0.060 inches wide by 0.220 inches long. Around these solder-free regions, parts measuring 0.120 inches wide by 0.280 inches long were punched, resulting in a part with solder in a "ring" formation, nominally 0.030 inches wide around the perimeter of one side of the part. These parts were then electroplated over their entire surface with 25 microinches of gold. These parts were tested for solder wettability in a furnace with nitrogen atmosphere and low oxygen (less than 5 ppm) at a peak temperature of 340° C. The solder exhibited acceptable wetting characteristics. The same parts were also functionally tested on ceramic packages with gold-plated seal rings of appropriate dimensions. The parts produced hermetic seals passing fine and gross leak testing. The solder fillet from the edge of the parts out onto the seal ring was smooth and continuous. Minimal tendency to wet to the top surface around the perimeter was observed on these parts.

When roll cladding gold-tin, it is preferred that there is at least a 30% rolling reduction, with 50% yielding a more reliable bond between the clad layers. Because the gold-tin in alloy is quite brittle, it is best if it is annealed before cladding. Heated rolls during cladding are also preferred, with nominal rolling temperature of approximately 225° C. yielding good results. Automation of the punching of "ring" covers, using machine vision technology, is highly desirable to obtain optimum uniformity of the solder on the finished part.

EXAMPLE 6

Identical to Example 5, except the previously described plating mask was used on the nickel "top" side to yield a laser-markable part.

It is apparent from the foregoing that various changes and modifications may be made without departing from the invention. Accordingly, the scope of the invention should be limited only by the appended claims wherein what is claimed is:

What is claimed is:

1. A method of making a cover, with critical sealing surfaces fully plated, for an electronic package comprising:
   (a) providing a substrate in strip form with longitudinal surfaces and edges as a core for said cover;
   (b) continuously depositing a corrosion resistant material onto said strip surfaces;
   (c) continuously depositing solderable material over said corrosion resistant material on at least one side of said strip surfaces;
   (d) applying solder material over the solderable material to produce a clad strip;
   (e) stamping sections out of the soldered (clad) strip; and
   (f) plating said sections with solderable material to cover the critical sealing surface, including the edges, of said stampings to produce a cover with fully plated critical sealing surfaces.

2. A method according to claim 1 wherein said solder material is applied by roll cladding.

3. A method according to claim 1 wherein the solderable metal in step (f) is gold.

4. A method according to claim 1 further comprising masking off one side of the clad strip with non-conductive material before punching to facilitate identification of the solder side on the finished part.

5. A method according to claim 4 further comprising removing the plating mask.

6. A method according to claim 1 wherein in step (d) said solder material roll clad over said solderable material is a strip with discontinuous voids and each of the sections of the clad strip stamped out to produce package covers which encompass a void.

7. A method of making a cover for an electronic package with critical sealing surfaces fully plated comprising:
  (a) providing a substrate in strip or sheet form with longitudinal surfaces and edges as a core for said cover;
  (b) applying a solder material over at least one side of the substrate to achieve intimate attachment of the solder to the substrate;
  (c) removing sections out of the strip or sheet with solder material thereon; and
  (d) plating said sections with a solderable metal to cover the critical sealing surface, including the edges of said sections to produce a cover with fully plated critical sealing surfaces.

8. A method according to claim 7 wherein said sections are removed by stamping.

* * * * *

UNITED STATES PATENT AND TRADEMARK OFFICE
CERTIFICATE OF CORRECTION

PATENT NO. : 5,639,014
DATED : June 17, 1997
INVENTOR(S) : David M. Damiano; Mark Fery; Terry J. Oldham It is certified that error appears in the above-indentified patent and that said Letters Patent is hereby corrected as shown below:

Column 4, line 23, change "0.120x0,280" to -- 1.120x0.280 --.

Signed and Sealed this

Twenty-eighth Day of April, 1998

Attest:

BRUCE LEHMAN

*Attesting Officer*                    *Commissioner of Patents and Trademarks*